United States Patent [19]

Hammann, IV et al.

[11] Patent Number: 5,196,287
[45] Date of Patent: Mar. 23, 1993

[54] PROCESS FOR PRODUCING ENCAPSULATED PHOTOSENSITIVE COMPOSITION BY ALTERING THE CONCENTRATION OF THE INTERNAL PHASE DURING ENCAPSULATION

[75] Inventors: William A. Hammann, IV; Kerry Kovacs, both of Centerville; Margaret T. Thomas, Medway; Jing-Den Chen; Ranganatha Raghaven, both of Spring Valley, all of Ohio

[73] Assignee: The Mead Corporation, Dayton, Ohio

[21] Appl. No.: 565,388

[22] Filed: Aug. 9, 1990

Related U.S. Application Data

[63] Continuation-in-part of Ser. No. 255,795, Nov. 11, 1988, abandoned.

[51] Int. Cl.⁵ .............................................. G03C 1/72
[52] U.S. Cl. ................................... 430/138; 503/204
[58] Field of Search .......................... 430/138; 503/204

[56] References Cited

U.S. PATENT DOCUMENTS

| | | | |
|---|---|---|---|
| 4,399,209 | 8/1983 | Sanders et al. | 430/138 |
| 4,440,846 | 4/1984 | Sanders et al. | 430/138 |
| 4,454,083 | 6/1984 | Brown et al. | 428/402.21 |
| 4,587,194 | 5/1986 | Adair et al. | 430/138 |
| 4,806,446 | 2/1989 | Hatta et al. | 430/138 |
| 4,840,866 | 6/1989 | Kovacs et al. | 430/138 |
| 4,929,531 | 5/1990 | Lee et al. | 430/138 |
| 4,968,580 | 11/1990 | Lee et al. | 430/138 |
| 4,971,941 | 11/1990 | Dowler et al. | 430/138 |

Primary Examiner—Charles L. Bowers, Jr.
Assistant Examiner—Thomas R. Neville
Attorney, Agent, or Firm—Thompson, Hine and Flory

[57] ABSTRACT

A process for producing photosensitive microcapsules having an extended dynamic range and the microcapsules produced thereby are disclosed; the process includes:
(a) providing an emulsion of a multiplicity of droplets of an internal phase in a continuous phase; said internal phase including a photohardenable or photosoftenable composition and an image-forming agent wherein the composition of said internal phase incrementally or continuously varies; and
(b) forming a wall around said droplets.

26 Claims, 4 Drawing Sheets

PROCESS FOR PRODUCING ENCAPSULATED PHOTOSENSITIVE COMPOSITION BY ALTERING THE CONCENTRATION OF THE INTERNAL PHASE DURING ENCAPSULATION

CROSS-REFERENCE TO RELATED APPLICATION

This is a continuation-in-part of U.S. application Ser. No. 255,795, filed Nov. 11, 1988, now abandoned.

BACKGROUND OF THE INVENTION

1. Field of the Invention

The present invention relates to a process for producing an encapsulated photosensitive material having an extended dynamic range and improved continuous tone, and more specifically, to a process for producing such material by altering the concentration of the internal phase during encapsulation.

2. Description of the Prior Art

Imaging systems employing photosensitive microcapsules are described in U.S. Pat. Nos. 4,399,209 and 4,440,846, assigned to The Mead Corporation. These patents teach the formation of images by the exposure-controlled release of an image-forming agent from a microcapsule containing a photohardenable composition. The image-forming agent is typically a substantially colorless color precursor which reacts with a developer to form a visible image.

U.S. Pat. Nos. 4,842,976 and 4,576,891 disclose a full color imaging system wherein three sets of microcapsules which are sensitive to different bands of actinic radiation are employed. These microcapsules respectively contain cyan, magenta and yellow color precursors.

Panchromatic, full color, imaging systems wherein a panchromatic imaging sheet is exposed to visible light and subsequently developed are described in European Application No. 0233567.

Although the above-described inventions have significantly advanced imaging technology, the inventions still suffer from minor drawbacks. For example, for some photosensitive materials, the resulting H&D curve has a high gamma, causing a relatively narrow dynamic range. For applications which require or prefer continuous tone images, it is desired to extend the dynamic range of the materials.

In addition, for full color or panchromatic imaging systems, it is desirable that the systems be color balanced. Color imbalance may result when the H&D curves of respective cyan, magenta and yellow microcapsules are not properly aligned. Accordingly, it is desirable to devise a system wherein the H&D curves are aligned.

Several alternative means have been proposed to cure the above-described defects. For example, U.S. Pat. No. 4,882,259 discloses photosensitive microcapsules wherein a solid diluent, typically a wax or fatty acid or alcohol, is incorporated into the internal phase of microcapsules. The incorporation of the solid diluent extends the dynamic range of the microcapsules.

U.S. Pat. No. 4,873,168 discloses a photosensitive imaging method utilizing a heating step. In some photosensitive compositions, heating the microcapsule imaging sheet prior to exposure to actinic radiation functions to extend the dynamic range of the photosensitive microcapsules.

U.S. Pat. No. 4,840,866 discloses a microcapsule imaging system having an extended dynamic range. The dynamic range is extended by utilizing a mixture of two or more independently prepared sets of microcapsules having the same spectral sensitivity but different film speeds. To obtain different film speeds, various techniques may be used including: different concentrations of photoinitiators, different photoinitiators or different concentrations of photopolymerizable monomers, incorporating a radiation absorber in one set of the microcapsules and a different amount or no amount of absorber in the other set of microcapsules, utilizing different wall formers for preparing the respective microcapsules, or varying the size of the microcapsules.

Although the above-described methods have helped to remedy the above-described defects, they require the preparation of two or more types of microcapsules, the incorporation of additional materials into the internal phase of the microcapsules, or altering imaging process conditions. Further, undesirable photographic characteristics sometimes result. For example, when producing a composition from two sets of microcapsules having H&D curves with different gammas an unacceptable hump occasionally develops in the resulting H&D curve. Although the dynamic range of the mixture of different speed microcapsules is extended, the hump in the H&D curve introduces problems in achieving color balance.

Accordingly, it would be desirable to develop an encapsulated photosensitive composition having an extended dynamic range and improved photographic properties wherein the photosensitive composition may be produced in a single batch and wherein process conditions during imaging do not have to be altered.

SUMMARY OF THE INVENTION

The present invention relates to an improvement in imaging systems employing photosensitive microcapsules wherein the composition of the internal phase of a single batch of microcapsules is altered during encapsulation to produce a single set of microcapsules having internal phases which exhibit different film speeds. The different film speed microcapsules are employed to control the shape of the H&D curve and improve the photographic characteristics of the photosensitive material, including the dynamic range.

While the present invention can be used to produce images for a monochromatic imaging system, it may also be used in a full color system, and more particularly a panchromatic system, as a means to match the gamma of the H&D curves of the cyan, magenta and yellow microcapsules and thereby improve color balance. For example, it may be useful in slowing the toe speed of magenta microcapsules to bring the magenta H&D curve into alignment with the cyan and yellow H&D curves.

The invention is most easily understood as involving three species or manifestations, each of which is premised upon the formation of a coating composition containing microcapsules in which the film speed of the internal phase continuously or incrementally varies. In each case, the composition of the internal phase is controlled through internal phase blending techniques and pre-wall formation to give the desired H&D curve, dynamic range and continuous tone. In one embodiment, the composition of the internal phase is continuously or incrementally modified as it is added to a continuous phase through the addition of a modifier.

In a second embodiment, high film speed and low film speed internal phase compositions are continuously or incrementally blended and the blended phase in turn is continuously or incrementally added to a continuous phase where it is emulsified and the microcapsule is built.

In a third embodiment, a first and a second emulsion are formed, one emulsion contains a higher film speed internal phase and the other contains a lower film speed internal phase, a permeable barrier may be formed around droplets formed in the emulsions, and the emulsions are blended under conditions which are controlled such that as a result of intermixing of the internal phases in the blended emulsion, the internal phase composition incrementally or continuously varies in the droplets. The walls are then built around the droplets of the internal phase and/or the permeable barrier if such exists.

The second embodiment is a preferred embodiment. In one process in accordance with this embodiment, high speed and low speed internal phases are blended in different ratios to provide a plurality of blended phases in which the film speed of each phase is different. These blended phases are used to form a plurality of emulsions. Each emulsion is held until a permeable barrier forms around the droplets (this permits slight intermixing and coalescence of the droplets) and the emulsions are then blended. Microcapsule walls are built around the permeable barriers and the droplets in the blended emulsion to provide a composition in which there are incremental differences in the film speeds of the microcapsules.

In accordance with another process, high speed and low speed internal phases are incrementally blended in different ratios and incrementally added to a common continuous phase. After each addition, the emulsion is held to allow a permeable barrier to form around the newly added droplets of the blended internal phase. After the permeable barrier has formed, the next increment of blended internal phase having a different high speed to low speed ratio is added. After all increments have been added, the microcapsule walls are formed around the permeable barriers and the droplets and a photosensitive coating composition in which the microcapsules have incremental differences in film speed is obtained.

In a third process, which is most preferred, different film speed internal phases such as a high film speed and an intermediate film speed internal phase are incrementally blended and incrementally added to a continuous phase where they are emulsified. Again, after the addition of each increment of blended internal phase, the emulsion is held to permit the permeable barrier to form and thereby permit slight increments of internal phase intermixing and coalescing with previous increments. This process is repeated with a second pair of internal phases having different film speeds such as an intermediate film speed and a low film speed internal phase. Again, after incremental addition, a permeable barrier is formed around the droplets. The emulsions obtained by these two processes are then mixed and microcapsule wall formation is completed.

In practicing the invention, it is important that the degree of intermixing or coalescence of the internal phase be controlled. If intermixing or coalescence is not controlled, the concentration of the internal phase will gradually equalize and no incremental or continuous variation will be achieved. In the most typical embodiments of the invention, the blending of the internal phase will be conducted incrementally and after each incremental addition, a permeable barrier will be formed to prevent much intermixing. In accordance with the most preferred embodiments of the invention, formation of the permeable barrier is accelerated through the use of certain catalysts as discussed below.

Accordingly, one embodiment of the present invention comprises a process for producing a microencapsulated photosensitive composition having broadened dynamic range comprising the steps of:

(a) providing an emulsion of a multiplicity of droplets of an internal phase in a continuous phase; said internal phase including a photohardenable or photosoftenable composition and an image-forming agent wherein the composition of said internal phase incrementally or continuously varies, and (b) forming a wall around said droplets.

In one embodiment of the invention, the emulsion is formed by dispersing a portion of a first internal phase into a continuous phase, modifying the second portion of the first internal phase with a modifier to alter film speed, and dispersing the second portion in the continuous phase. This process can be carried out continuously or incrementally. For the process to be effective, while some intermixing or coalescence of the internal phase droplets may be permitted, generally the droplets must be stabilized by a permeable barrier in order to prevent intermixing.

In another embodiment of the present invention, a process for producing a microencapsulated photosensitive composition comprising the steps of:

(a) providing a first internal phase having a first film speed;

(b) providing a second internal phase having a second film speed;

(c) continuously or incrementally blending said first phase with said second phase to form a blended phase in which the ratio of said first phase and said second phase varies;

(d) continuously or incrementally providing said blended phase to a continuous phase to form an emulsion in which said blended phase forms droplets in which the concentration of said first and second phases varies;

(e) Stabilizing said droplets; and (f) forming a wall around said droplets.

In accordance with a preferred embodiment of the immediately foregoing process, said first and second internal phase are incrementally blended and incrementally dispersed in the continuous phase. After each incremental addition of the blended phase to the continuous phase, a permeable barrier is allowed to form around the droplets in the continuous phase, thereby stabilizing them and preventing substantial intermixing and coalescence.

In accordance with another embodiment, said first and second internal phases are incrementally blended to provide a plurality of blended phases having different ratios of first to second internal phase. These blended phases are each added to a continuous phase to provide a plurality of emulsions. The emulsions are held to permit a permeable barrier to form and blended whereafter microcapsule walls are formed.

In yet another embodiment, the present invention comprises a process for producing a microencapsulated photosensitive composition comprising the steps of:

(a) providing a first internal phase having a first film speed in a first continuous phase to form a first emulsion;

(b) providing a second internal phase having a second film speed into a second continuous phase to form a second emulsion;

(c) blending said first emulsion and said second emulsion to form a blended emulsion containing droplets of a blended internal phase in which the amounts of said first and second internal phases continuously or incrementally varies; and (d) forming a wall around said droplets.

In still another embodiment, the present invention comprises the steps of:

(a) providing a first internal phase having a first film speed;

(b) providing a second internal phase having a second film speed;

(c) providing a third internal phase of a third film speed;

(d) incrementally or continuously blending said first internal phase with a first portion of said second internal phase to form a first blended phase in which the amounts of said first and second internal phases incrementally or continuously varies;

(e) incrementally or continuously providing said first blended phase into a first continuous phase to form a first emulsion such that said first blended phase forms droplets;

(f) incrementally or continuously blending said third internal phase with a second portion of said second internal phase to form a second blended phase in which the amounts of said second and third internal phases continuously or incrementally varies;

(g) providing said second blended phase into a second continuous phase to form a second emulsion such that said second blended phase forms droplets;

(h) stabilizing said droplets by forming a permeable barrier around said droplets;

(i) blending said first emulsion and said second emulsions to form a blended emulsion; and (j) forming a wall around said droplets.

In accordance with the most preferred embodiment of the immediately proceeding process, the first and second internal phases are incrementally blended and, in turn, incrementally added to a continuous phase. After each incremental addition, a permeable barrier is allowed to form around the droplets to stabilize the droplets and thereby prevent excessive intermixing or coalescence. Similarly, the second and third internal phases are incrementally blended and incrementally added to the continuous phase and after each incremental addition, a permeable barrier is allowed to form around the droplets to stabilize the droplets. The first and second emulsions are then blended and a wall is formed around the droplets.

In the preferred embodiments the internal phase contains a photohardenable monomer and a photoinitiator and the concentration of the photoinitiator varies in the internal phase of the microcapsules to provide a continuous or incremental concentration gradient. In addition, or in the alternative, the present invention may be utilized to provide microcapsules in which the internal phases contain varying concentrations of an image-forming agent (some image-forming agents have been observed to enhance film speed while others may decrease it), an absorber, photosensitive monomer, a coinitiator, or a photoinhibitor. It is important that the variable concentration of the internal phase is produced prior to forming microcapsule walls around the microcapsules.

A further embodiment of the present invention relates to a photosensitive composition having an extended dynamic range produced by the above-described process.

Accordingly, it is an object of the present invention to provide a process for producing a microencapsulated photosensitive composition having extended dynamic range and improved photographic characteristics in a single batch.

It is a further object of the present invention to provide a photosensitive material employing a microencapsulated photosensitive composition having an extended dynamic range and improved photographic characteristics.

These, and other objects, will be readily recognized and understood in the art as reference is made to the following detailed description of the preferred embodiment.

DEFINITION

The term "incrementally or continuously varies" relates to the concentration of a constituent of the internal phase of the resultant invention microcapsules. The term "incrementally" defines that the variance in the constituent is produced by a process which stepwise alters the concentration of the characteristic. The term "continuously" defines that the variance in the constituent is produced by a process which continuously alters the concentration of the constituent.

DETAILED DESCRIPTION OF THE PREFERRED EMBODIMENTS

While describing the preferred embodiments, specific terminology will be utilized for the sake of clarity. It is to be understood that such terminology includes not only the recited embodiments, but all technical equivalents which perform substantially the same function in substantially the same way to produce the same result.

Reference can be made to U.S. Pat. Nos. 4,399,209 and 4,440,846, U.K. Patent 2,113,860 and European Published Application 0 233 587 for examples of imaging systems, including full color and panchromatic imaging systems which can be modified in accordance with the present invention to provide microcapsules having controlled gamma, H&D curve shape, and improved dynamic range, continuous tone and film speed.

In accordance with the present invention, an encapsulated photosensitive composition having an extended dynamic range and more continuous tone is produced by altering the composition of the internal phase prior to encapsulation to produce microcapsules in which there is a continuous or incremental variation in film speed. To produce the photosensitive composition, a continuous phase, an initial internal phase, and an internal phase modifying agent are used and the interrelationship between these phases is shown in FIG. 1 for one embodiment of the invention.

Figure 1:
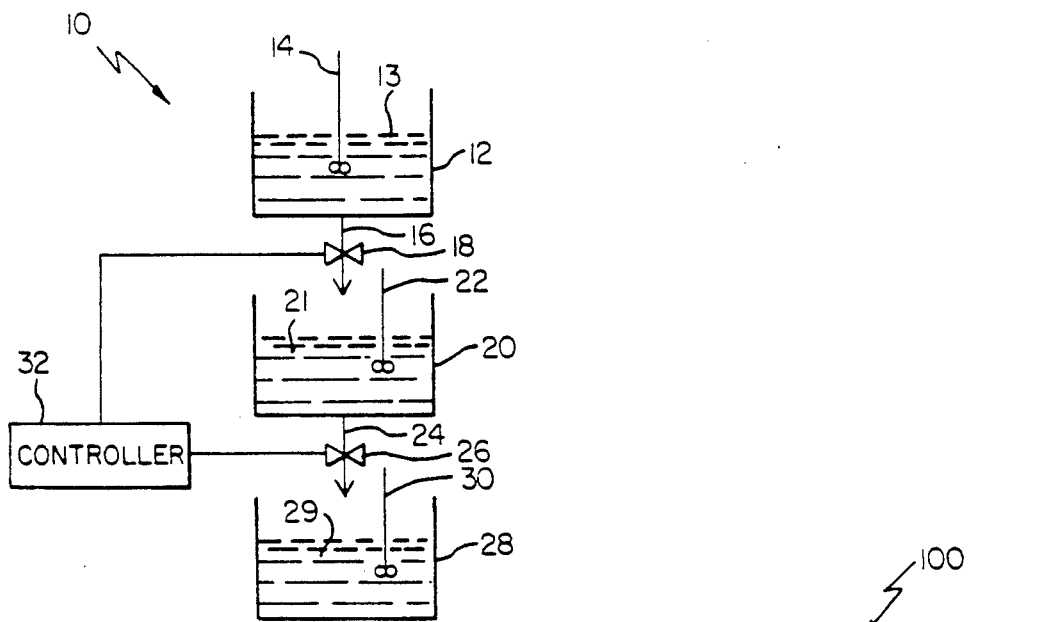
FIG. 1 is a schematic diagram of the system embodying the teachings of the instant invention.

The description of the inventive system 10 and process as shown in FIG. 1 is made with respect to an embodiment wherein a modifying material such as monomer is used to incrementally dilute the concentration of the photoinitiator to produce a photosensitive composition having a broadened dynamic range. However, the process and system described with respect to FIG. 1 may be used similarly in connection with any of the modifying materials as described below.

As shown in FIG. 1, tank 12 having stirrer 14 contains the internal phase modifying agent 13. In communication with tank 12 through pipe 16 is tank 20. Regulation of the flow of modifying phase 13 through pipe 16 is accomplished by flow regulation means such as valve 18, which is actuated and controlled by controller 32, typically a computer.

Tank 20 having stirrer 22 contains internal phase 21 as defined above. In communication with tank 20 through pipe 24 is tank 28. Regulation of the flow of internal phase 21 through pipe 24 is accomplished by flow regulation means such as valve 26, or a pump which is actuated and controlled by controller 32.

Tank 28 having stirrer 30 contains continuous phase 29 as defined above.

To produce photosensitive microcapsules according to the present invention tank 12 is filled with modifying phase 13, tank 20 is filled with internal phase 21, and tank 28 is filled with continuous phase 29. Valves 18 and 26 are in a closed position. At this stage of the process, internal phase 21 should have a high concentration of image-forming agent and photoinitiator present. For example the solution in phase 21 contains approximately 0.0053 parts photoinitiator per part monomer.

Controller 32 opens valve 26 to enable a portion of internal phase 21 to pass through pipe 24 and into tank 28 where it is dispersed by forming droplets in continuous phase 29 and is stirred by stirrer 30. After a portion of internal phase 21 has been dispersed, controller 32 closes valve 26 to prevent any additional internal phase 21 from passing through pipe 24 into tank 28. At this stage in the process, tank 28 has dispersed in its continuous phase droplets of an internal phase having a relatively high concentration of photoinitiator. Preferably, these droplets are stabilized by formation of a permeable barrier around the droplets so that intermixing only slightly occurs when the next increment of diluted internal phase is added.

While stirrer 30 continues to operate in tank 28, controller 32 opens valve 18 to enable a predetermined amount of modifying phase 13 to pass through pipe 16 and into tank 20 where it mixes with internal phase 21 with the aid of agitation from stirrer 22 to cause the concentration of the image-forming agent and photoinitiator in internal phase 21 to be reduced. Once a desired concentration of color-forming agent and photoinitiator is achieved, controller 32 closes valve 18 to prevent any additional modifying phase 13 from passing through pipe 16 into tank 20. The concentration of the resulting internal phase 21 contains approximately 0.003 parts photoinitiator per part monomer.

With valve 18 closed, controller 32 opens valve 26 to allow the dilute internal phase 21 to pass through pipe 24 and disperse and form droplets in continuous phase 29. At this point in time continuous phase 29 contains droplets of an emulsified high photoinitiator concentration internal phase and droplets of an emulsified dilute photoinitiator concentration internal phase. Reaction of a permeable barrier former initially present in phase 21 prevents the emulsified internal phases from completely intermixing, although some controlled intermixing may be desirable in some cases. This can be controlled by controlling the start of or rate of permeable barrier formation. When the desired amount of dilute internal phase 21 has been dispersed in continuous phase 29, controller 32 closes valve 26 to prevent any additional dilute internal phase 21 from passing through pipe 24. For many applications, the maintenance of droplets of two different concentration internal phases may be sufficient to produce the extended dynamic range microcapsules. If, however, additional lower concentration internal phases 21 are desired to be dispersed in continuous phase 29, the above process may be repeated for as many times as required to produce a desired dispersion.

Alternatively, the process described in connection with FIG. 1 may be performed on a continuous basis. To accomplish this, valves 18 and 26 are maintained in an open position with controller 32 controlling the rate of flow of liquid through valves 18 and 26. In this embodiment, the resultant droplets dispersed in continuous phase 29 should have a photoinitiator concentration gradient ranging from the concentration of photoinitiator in phase 13 to the concentration of photoinitiator in phase 21.

Figure 2:
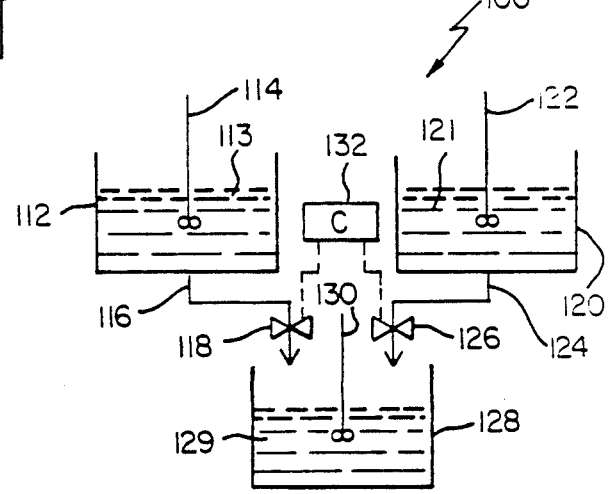
FIG. 2 is a schematic diagram of an alternative system embodying the teachings of the instant invention.

In an embodiment wherein two independently prepared internal phases are dispersed in the same aqueous phase to form a photosensitive material having a varying concentration of internal phase within the dispersed droplets, the system as shown in FIG. 2 may be utilized. As seen in FIG. 2, tank 112, containing stirrer 114 has contained within it internal phase 113. Internal phase 113 typically contains a photohardenable monomer, an image-forming agent and a photoinitiator having a first concentration.

Tank 120, containing stirrer 122 has contained within it internal phase 121. Internal phase 121 differs from internal phase 113 in at least one aspect. For example, internal phase 121 may contain identical concentrations of monomer and image forming agent but may contain a different concentration of photoinitiator. Alternatively, internal phase 121 may contain a co-photoinitiator, photoinhibitor, and the like.

To produce the photosensitive composition having a variable concentration internal phase, valves 118 and 126 are opened by controller 132 in a manner similar to controller 32 of FIG. 1 to enable internal phase 113 to pass through line 116 into tank 128 and enable internal phase 121 to pass through line 124 into tank 128. Depending on the operation of valves 118 and 126, internal phase 113 and internal phase 121 can be incrementally or continuously added to tank 128 to form phase 129 which is agitated by stirrer 130 and contains droplets having variable concentrations of internal phase in a continuous phase. It is believed that in addition to the droplets of phase 129 containing the internal phase concentration of phases 113 and 121, some intermixing occurs as a result of droplet coalescence prior to wall formation. By limiting intermixing, a blend is obtained in which a gradient in the amounts of the internal phases is produced. Alternatively, the internal phases 113 and 121 are incrementally added to the continuous phase 129, intermixing is allowed to occur, and then a permeable barrier is formed around the droplets. This process is repeated and the relative amounts of internal phases 113 and 121 is varied each time to produce an emulsion in which the relative amount of internal phases in the droplets varies.

Figure 4:
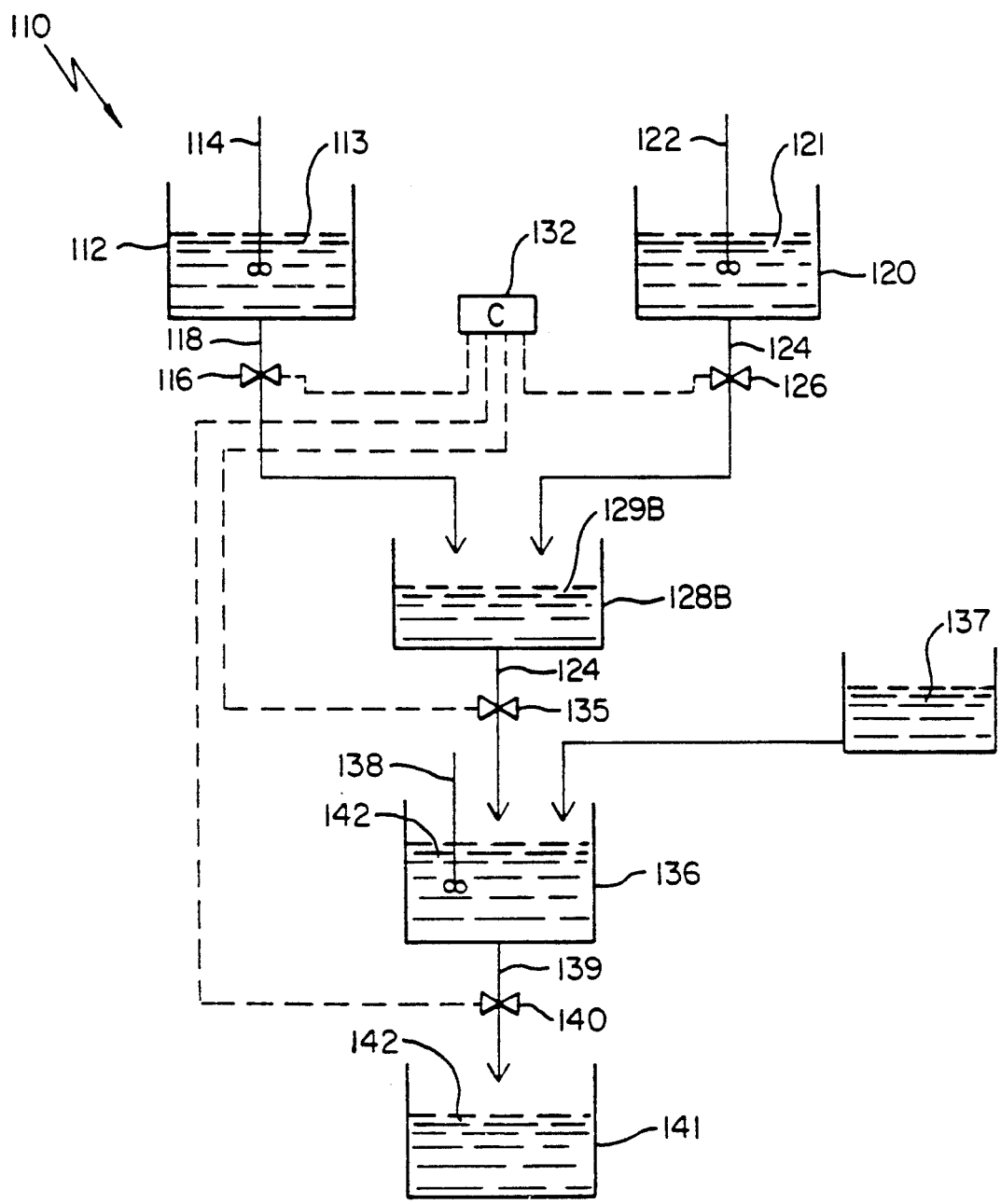
FIG. 4 is a schematic diagram of another system embodying the teachings of the present invention.

Optionally, and as shown in FIG. 4, internal phase 113 and internal phase 121 may pass via a blending means 128B such as an in-line mixer to form a blended phase 129B. The blended phase 129B may then pass through line 134 into tank 136 incrementally or continuously depending on the operation of valve 135 which is controlled by controller 132. A continuous phase 137 and a stirrer 138 are provided in tank 136. Blended phase 129B and continuous phase 137 can be agitated by stirrer 138 to form an emulsion 142 such that the blended phase 129B forms droplets. The emulsion 142 may be transferred to tank 141 via line 139 in either an incremental or continuous fashion depending on the operation of valve 140 which is controlled by controller 132. Wall formation around the droplets can take place in tank 141. Permeable barrier formation is conducted in tank 136 or tank 141 to prevent intermixing.

In still another embodiment, instead of mixing together two different internal phases, two different emulsions of a similar type (e.g. oil-in-water) may be mixed together to form a photosensitive material having a varying concentration of internal phase within the dispersed droplets. To accomplish this, a system such as that shown in FIG. 2 is used wherein composition 113 is a first emulsion having droplets of a first internal phase concentration dispersed in a continuous phase and composition 121 is a second emulsion having droplets of a second internal phase concentration dispersed in a continuous phase. To mix emulsions 113 and 121, valves 118 and 126 are opened to enable emulsions 113 and 121 respectively to pass into tank 128 and stirrer 130 is actuated.

Figure 5:
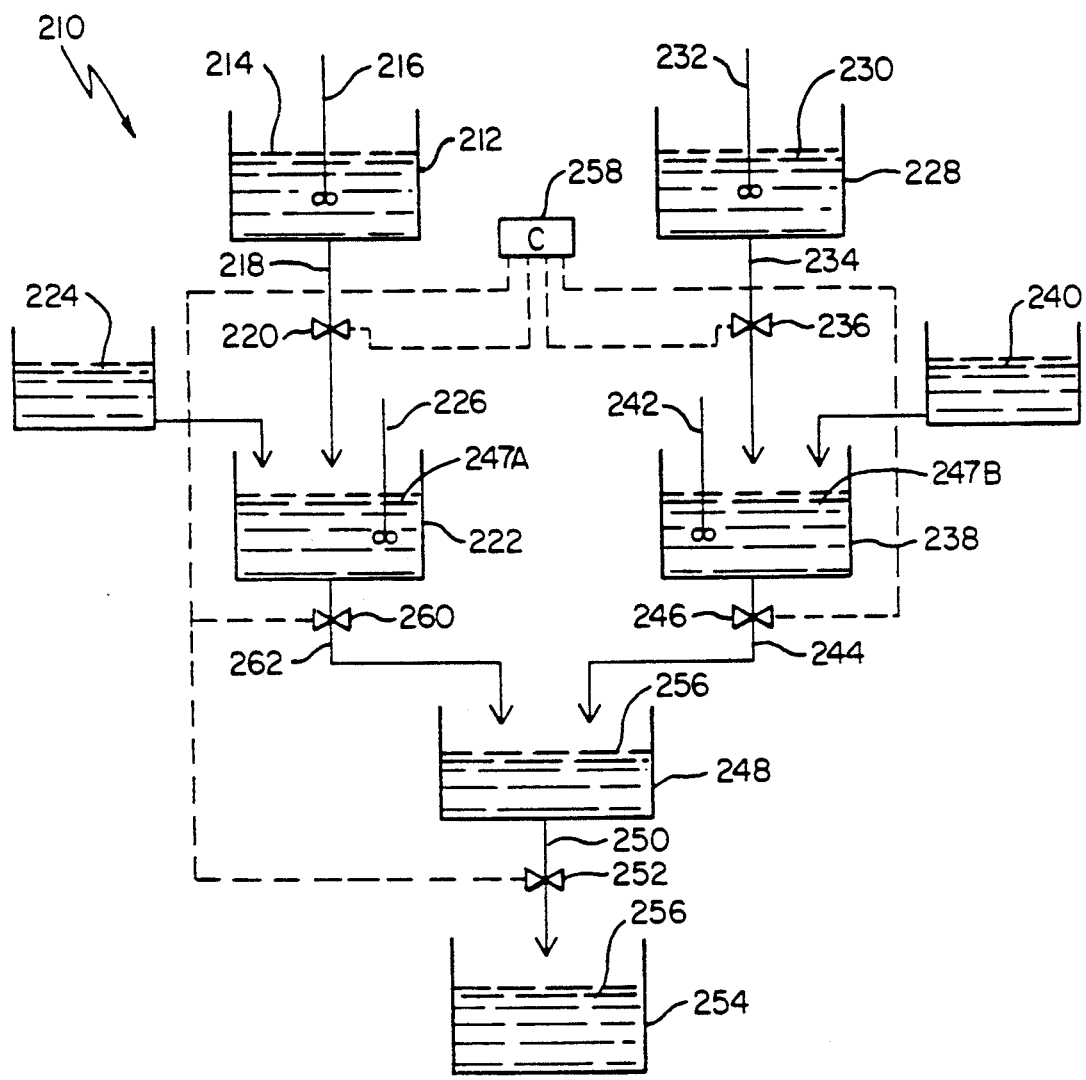
FIG. 5 is a schematic diagram of yet another system embodying the teachings of the present invention.

More particularly, the mixing of two emulsions is depicted in FIG. 5 and is generally represented by process 210. Tank 212, containing stirrer 216 has contained within it internal phase 214. Tank 228, containing stirrer 232 has contained within it internal phase 230. Internal phase 214 differs from internal phase 230 in at least one aspect affecting film speed, as described above. Internal phase 214 may pass through line 218 into tank 222 which also contains continuous phase 224 and stirrer 226. Internal phase 230 may pass through line 234 into tank 238 which also contains a continuous phase 240 and stirrer 242. Valves 220, 236, 260, 246 and 252 are controlled by controller 258 which allows for incremental or continuous flow. Internal phase 214 and continuous phase 224 may be agitated by stirrer 226 to form emulsion 247A such that internal phase 214 forms droplets, and similarly internal phase 230 and continuous phase 240 may be agitated by stirrer 242 to form emulsion 247B such that internal phase 230 forms droplets. Emulsions 247A and 247B can pass through lines 262 and 244, respectively, into blending means 248 for blending emulsions. Blending means 248 may be a tank with stirrer therein or an in-line blending system. A permeable barrier may be formed around the droplets. Upon blending emulsions 247A and 247B, a blended emulsion 256 is formed which can pass through line 250 into tank 254. Wall formation may take place in tank 254.

In a most preferred embodiment, at least a portion of two internal phases having different film speed are blended and introduced into a continuous phase to form an emulsion, and a third internal phase differing in film speed from either other internal phase is blended with one of the other internal phases to form a second emulsion. A permeable barrier may be formed around the droplets. The two separate emulsions are then combined, and optionally blended, to form a blended emulsion. The wall is completely formed around the permeable barrier and the droplets in the blended emulsion.

Figure 6:
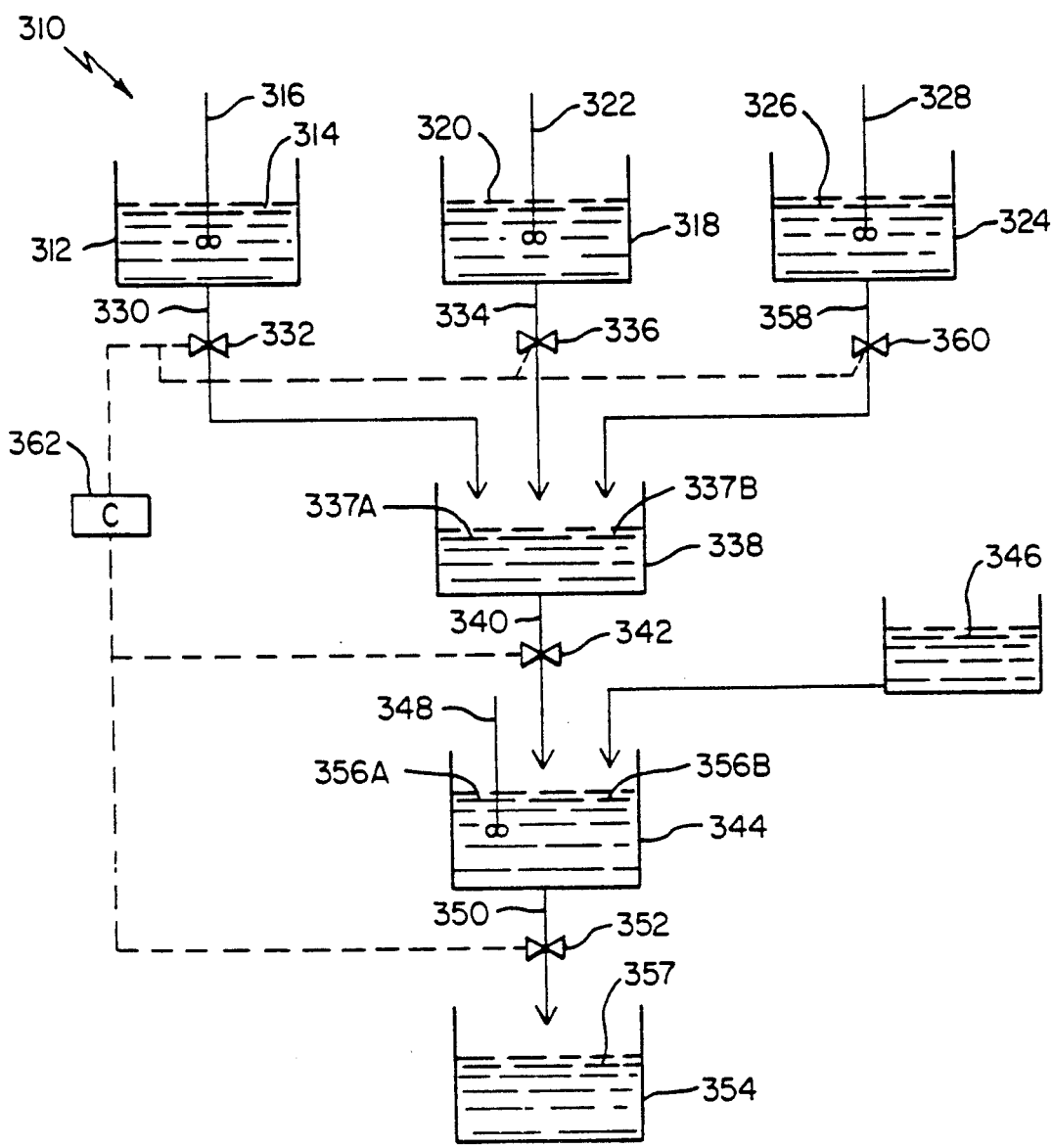
FIG. 6 is a schematic diagram of still another system embodying the teachings of the present invention.

FIG. 6 more particularly depicts the process 310 which produces the photosensitive composition having a variable concentration in the internal phase. Tank 312, containing stirrer 316 has contained within it internal phase 314. Tank 318, containing stirrer 322 has contained within it internal phase 320. Tank 324, containing stirrer 328 has contained within it internal phase 326. Internal phases 314, 320 and 326 vary in at least one aspect wherein internal phase 314 is of the highest concentration of a component, internal phase 326 is of the lowest concentration of that component, and internal phase 320 is of an intermediate concentration of that component such that film speed varies from high, intermediate to low. For example, the internal phases may contain varying amounts of photopolymerizable monomer but may contain different concentrations of image-forming agent or photoinitiator.

Valves 332, 336, 360, 342 and 352 are controlled by controller 362 which allows for incremental or continuous flow through lines 330, 334, 358, 340 and 350, respectively. Internal phase 314 and a portion of internal phase 320 can pass through lines 330 and 334, respectively, into blending means 338 for blending internal phases therein. Blending means 338 can be a blending tank with stirrer therein or an in-line blending system. Upon blending internal phases 314 and the portion of 320, a first blended phase 337A is formed which may pass through line 340 into tank 344 which has contained within it a portion of continuous phase 346 and stirrer 348. Stirrer 348 can agitate blended phase 337A and continuous phase 346 to form an emulsion 356A such that blended phase 337A forms droplets. A permeable barrier may be formed around the droplets. Emulsion 356A can then pass through line 350 into tank 354. Consecutively, internal phase 326 and a second portion of internal phase 320 can pass through lines 358 and 334, respectively, into blending means 338 to form a second blended phase 337B. Blended phase 337B can pass through line 340 into tank 344 which has contained within it another portion of continuous phase 346. Stirrer 348 can agitate blended phase 337B and continuous phase 346 to form emulsion 356B such that blended phase 337B forms droplets. A permeable barrier may be formed around the droplets. Emulsion 356B can pass through line 350 to tank 354 to combine with emulsion 356A to form blended emulsion 357. Complete wall formation can then be performed in tank 354. It is appreciated that the blending of phases can be performed in separate tanks and ultimately introduced into the same tank for curing. However, the above embodiment is preferred for economical advantages.

In most common encapsulation processes, the continuous phase is aqueous and an oil-in-water emulsion is used for producing the inventive photosensitive composition. However, as will be recognized in the art, the present invention may be practiced by using an organic phase and a water-in-oil emulsion.

The continuous phase preferably includes agents known as emulsifiers and system modifiers to control the size and uniformity of the microcapsules and to produce individual mononuclear capsules in preference to clusters of microcapsules. Useful emulsifiers and system modifiers are well known in the art. Their selection will depend on the type of microencapsulation process used and the nature of the wall formers. For making melamine-formaldehyde microcapsules a combination of methylated polygalacturonic acid (e.g., pectin) and sulfonated polystyrenes is preferred. The polygalacturonic acid acts as a stabilizer for the aqueous phase, and the sulfonated polystyrenes aid in emulsification. See U.S. Pat. No. 4,608,330 and U.S. Ser. No. 370,103 filed Jun. 22, 1989 (allowed). In addition, the concentration of the emulsifiers and modifiers in the aqueous phase may be selected to correspond to the amount of desired coalescence, and hence, intermixing of the dispersed droplets. In all embodiments of the invention, droplet intermixing is controlled so as to maintain a continuous of incremental gradient in the film speed of the capsules. If droplet intermixing occurs freely, the microcapsules will all have essentially the same film speed. The principal means to control droplet intermixing and coalescence is through controlling the formation of the permeable barrier as discussed below.

The initial internal phase is designed so that it may be readily dispersed in the aqueous phase. The internal phase typically includes an image-forming agent, and a photohardenable or photosoftenable composition.

Various image-forming agents can be used in the internal phase. For example, images can be formed by the interaction of color formers and color developers of the type conventionally used in the carbonless paper art. In addition, images can be formed by the color producing interaction of a chelating agent and a metal salt or by the reaction of certain oxidation reduction reaction pairs, many of which have been investigated for use in pressure-sensitive carbonless papers. Alternatively, an oil soluble dye can be used and images can be formed by transfer to plain or treated paper. The internal phase itself has its own image-forming capability. For example, it is known that many of the toners used in xerographic recording processes selectively adhere to the image areas of an imaging sheet exposed and developed as in the present invention.

Typical color-forming agents useful in the aforesaid embodiments include colorless electron donating type compounds. Representative examples of such color formers include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Cyan, magenta and yellow color precursors useful in the present invention are particularly preferred and are commercially available.

A positive working photohardenable or a negative working photosoftenable radiation sensitive composition is also present in the dispersed internal phases. Photohardenable compositions such as photopolymerizable and photocrosslinkable materials increase in viscosity or solidify upon exposure to radiation and yield positive images.

Ethylenically unsaturated organic compounds are useful radiation curable materials. These compounds contain at least one terminal ethylene group per molecule Typically, they are liquid. Polyethylenically unsaturated compounds having two or more terminal ethylene groups per molecule are preferred. An example of this preferred subgroup is ethylenically unsaturated acid esters of polyhydric alcohols, such as trimethylol propane triacrylate (TMPTA) and dipentaerythritol hydroxypentaacrylate (DPHPA).

The internal phase also typically includes a photoinitiator. A preferred photoinitiator system for use in the present invention includes ionic dye-counter ion compounds described in U.S. Pat. No. 4,772,541. A preferred class of ionic dye-counter ions is cationic dye borates and still more particularly cyanine dye borates. Typically the borate is a triphenylalkyl borate such as a triphenylbutyl borate. Other dye complexes such as Rose Bengal iodonium and Rose Bengal pyryllium complexes may also be used.

Examples of other photoinitiators useful in the present invention include diaryl ketone derivatives, quinones and benzoin alkyl ethers. Where ultraviolet sensitivity is desired, suitable photoinitiators include alkoxy phenyl ketones, 0-acylated oximinoketones, polycyclic quinones, phenanthrenequinone, naphthoquinone, diisopropylphenanthrenequinone, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones and haloalkanes. In many cases it is advantageous to use a combination with imaging photoinitiators.

Initiators including the ionic dye complexes may preferably include an autoxidizer. Suitable examples include N,N,-dialkylanilines as described in the European Publication.

It is preferred that the droplets of the internal phase do not completely mix after dispersing them in the continuous phase. Intermixing can be controlled through appropriate choice of the emulsifier, through the use of a permeable barrier as discussed below, or by controlling agitation conditions.

The internal phase contains a compound which is able to form a permeable barrier around the initial concentration internal phase when emulsified in the continuous phase. For example, a polyisocyanate may be contained in the internal phase. Upon dispersing the internal phase in an aqueous continuous phase, the polyisocyanate is believed to react with water at the interface of the internal phase in the aqueous medium and form a thin layer of a polyurea polymer around the internal phase.

For the systems as depicted in FIG. 4 and 6, it is desirable .o add a catalyst to the continuous phase before the internal phase is combined therewith which accelerates formation of the permeable barrier. If permeable barrier formation does not occur sufficiently rapidly, intermixing may nullify the internal phase variation. The reaction velocity of the permeable barrier forming reactants may be influenced by a catalyst of the type commonly used for polyurea and polyurethane-forming reactions. In this way, the degree of intermixing of the internal phase droplets in the emulsion can be limited so as to maintain the incremental or continuous variation as desired. In some cases, the catalyst can be added to the internal phase composition instead of or in addition to the continuous phase.

The following are examples of suitable catalysts:

Tertiary amines, such as triethylamine, tributylamine, N-methyl morpholine, N-ethyl morpholine, N-cocomorpholine, N,N,N',N'-tetramethyl ethylene diamine, 1,4-diazabicyclo(2,2,2)-octane, N-methyl-N'-dimethyl aminoethyl piperazine, N,N-dimethyl benzylamine, bis-(N,N-dimethylaminoethyl)adipate, N,N-diethyl benzylamine, pentamethyl diethylene, triamine, N,N-dimethyl cyclohexylamine, N,N,N',N'-tetramethyl-1,3-butane diamine, 1,2-dimethyl imidazole, 2-methyl imidazole, etc.;

Tertiary amines containing isocyanate-reactive hydrogen atoms, for example triethanolamine, triisopropanolamine, N-methyl diethanolamine, N-ethyl diethanolmine, N,N-dimethyl ethanolamine and reaction products thereof with alkylene oxides, such as propylene oxide and/or ethylene oxide;

Silaamines containing carbon-silicone bonds of the type described, for example, in German Pat. No. 1,229,290, for example 2,2,4-trimethyl-2-silamorpholine, 1,3-diethylaminomethyl tetramethyl disiloxane, etc.;

Nitrogen-containing bases, such as tetra-alkyl ammonium hydroxides, alkali metal hydroxides, such as sodium hydroxide, alkali metal phenolates, such as sodium phenolate, or alkali metal alcoholates, such as sodium methylate, and hexahydrotriazines, etc.; and Organometallic compounds, particularly organotin compounds, preferably tin(II)salts of carboxylic acids, such as tin(II)acetate, tin(II)octoate, tin(II)ethyl hexoate and tin(II)laurate, and the dialkyl tin salts of carboxylic acids, such as dibutyl tin diacetate, dibutyl tin dialurate, dibutyl tin maleate or dioctyl tin diacetate.

Other catalysts and information on the way in which they work may be found in Kinststoff Handbuch, Vol VII, by Vieweg and Hochtlen, Carl-Hasner-Verlag, Munich, 1966, in particular on pages 96 to 102.

For the embodiment illustrated in FIG. 1, an internal phase concentration modifier is used to incrementally or continuously modify the film speed of the internal phase prior to encapsulation. The material used to modify the concentration should be miscible with the internal phase. In the preferred embodiment, the modifying material is used to dilute the concentration of the photoinitiator in the internal phase. However, as will be discussed in greater detail below, the modifying material may function to alter the film speed of the internal phase in other ways such as acceleration or inhibition.

The modifying material in the preferred embodiment is a photopolymerizable monomer and it is preferable that the monomer is identical to the monomer contained in the internal phase. Trimethylolpropane triacrylate is particularly preferred. The incremental or continuous addition of the monomer to the internal phase functions to lower the overall concentration of photoinitiator and image-forming agent in the modified internal phase.

Alternatively, the modifying material may take the form of an inert liquid diluent which is miscible with the internal phase and is capable of lowering the concentration of the image forming agent and photoinitiator when added to the internal phase. Examples of such inert liquids include mineral oil and propylene carbonate.

In another embodiment, the modifying material may take the form of a co-initiator or autoxidizers. Co-initiators are known in the art and are compounds which interact with an absorber and directly or indirectly generate free radicals. Autoxidizers interact with the absorber and oxygen to increase film speed. When added to the internal phase, the co-initiator functions to increase the film speed of the internal phase. For example, when using a dye-borate system as defined in European Published Application 0 233 587, the co-initiator can be an N,Ndialkylaniline compound which enhances the film speed of the resultant composition.

In yet another embodiment, the modifying material may take the form of a photoinhibitor or radical scavenger. When added to the internal phase, the photoinhibitor or radical scavenger functions to limit the rate of photopolymerization of the internal phase, and lower the film speed. Examples of photoinhibitors are radical scavengers are set out in commonly assigned U.S. Pat. No. 4,587,194.

In yet another embodiment, the modifying material may be an image-forming agent. It has been found that certain image-forming agents enhance or reduce the film speed of the photosensitive composition. Hence, by changing the concentration of the image-forming agent, the dynamic range can be improved.

From the foregoing discussion, and particularly as discussed with respect to FIGS. 2, 5 and 6, those skilled in the art will appreciate that an equivalent result may be achieved by forming a second internal phase in which the foregoing modifiers are used to produce a difference in film speed and adding this to the first internal phase or by forming emulsion of the two internal phases and blending the emulsion.

After the concentration modifying procedures have been completed and the desired internal phases are dispersed in the continuous phase, microcapsule walls are formed around the internal phases. The discrete walled microcapsules formed around the different concentration internal phases in the present invention can be produced using known encapsulation techniques including coacervation, in situ polymerization, interfacial polymerization, polymerization of one or more monomers in an oil, etc. Representative examples of suitable wall-formers are gelatin materials (see U.S. Pat. Nos. 2,730,456 and 2,800,457 to Green et al.) including gum arabic, polyvinyl alcohol, carboxy-methyl-cellulose; resorcinol-formaldehyde wall formers (see U.S. Pat. No. 3,755,190 to Hart et al.); isocyanate wallformers (see U.S. Pat. No. 3,914,511 to Vassiliades); isocyanate-polyol wall-formers (see U.S. Pat. No. 3,796,669 to Kiritani et al.); urea-formaldehyde wall-formers, particularly urea-resorcinol-formaldehyde in which oleophilicity is enhanced by the addition of resorcinol (see U.S. Pat. Nos. 4,001,140; 4,087,376 and 4,089,802 to Foris et al.); and melamineformaldehyde resin and hydroxpropyl cellulose (see commonly assigned U.S. Pat. No. 4,025,455 to Shackle). A melamineformaldehyde capsule is particularly preferred.

The mean microcapsule size used in the present invention generally ranges from about 1 to 25 microns.

In the preferred embodiment, melamine-formaldehyde capsule walls are formed around the internal phases. This process is now described in more detail. Formation of the melamine-formaldehyde capsule walls is obtained by adding solutions of melamine and formaldehyde or a solution of a precondensate thereof to the oil in water emulsion. On reaction, any amine-formaldehyde condensate separates from the solution which wets and enwraps the dispersed internal phase droplets. After the walls have been solidified, the capsules may be separated from the medium and washed.

Selection of appropriate system modifiers and emulsifying agents is critical to controlling microcapsule size. A preferred system modifier is a combination of pectin and sulfonated polystyrene as described in U.S. Pat. No. 4,608,330 and U.S. application Ser. No. 370,103.

The condensation reaction proceeds under acid conditions, e.g., pH of 7 or less; however, the reaction is preferably carried out at a pH in the range of 2.5 to 6.0. The temperature of the encapsulation medium should be maintained at about 10° to 90° C., preferably about 25° to 85° C. and more preferably about 45° to 75° C.

Among the acid catalysts that may be used are low molecular weight carboxylic acids, e.g., formic acid, acetic acid, etc.; inorganic acids, e.g., sulfuric acid, hydrochloric acid, phosphoric acid, etc.; and acidic or easily hydrolyzable salts such as aluminum sulfate, ammonium nitrate, ammonium chloride, ammonium sulfate, etc. Ammonium salts are preferred as they seem to provide a stronger and less permeable capsule. The ammonium salts are usually employed in an amount of about 2 to 20% by weight based on the amount of urea.

The melamine and formaldehyde are preferably present, whether as a free monomer or as a precondensate, in a molar ratio of formaldehyde to melamine of at least 1.5 and preferably 2.0 to 3.0.

To reduce malodor and the incidence of skin irritation, when the polymerization reaction is complete, it is desirable to remove or react the excess formaldehyde. This can be accomplished by using any one of several known techniques such as the addition of phosphoric acid, urea, sulfite, bisulfite, ammonium salts, 2-imidazolidone, ethylene-n-methylolacrylamidevinylacetate copolymer, defatted soybean powder, isobutylene/maleic anhydride copolymer/ammonium salt, 5-methylbenzimidazole, dimethyloldihydroxyethyleneurea, carbohydrazide, water insoluble amino group containing polymers such as Amberlite IR45, 2-oxazolidone and dihydroxyacetone (dimer form). These materials react with the formaldehyde to form a product which does not interfere with the performance of the medium. The addition of urea or sodium sulfite to scavenge formaldehyde is preferably performed in a single step after encapsulation and prior to storage. The pH and temperature of the medium should be adjusted for this reaction. The sulfite is preferably reacted at a pH of 6 to 9 from room temperature to 85° C. for about two hours. The urea can be reacted at a pH of 3 to 5 or 8 to 12 at a temperature of 30°-60° C. for four hours.

To produce an imaging sheet the inventive photosensitive composition is coated onto a substrate. The most common substrate for imaging sheets in accordance with this invention is a transparent film or paper. The paper may be a commercial impact raw stock, or special grade paper such as cast-coated paper or chrome-rolled paper. Transparent substrates such as polyethylene terephthalate and translucent substrates can also be used.

Another preferred substrate for the microcapsules is aluminized polyethylene terephthalate. The microcapsules can be located on either the top or bottom surface of a transparent substrate to form an imaging sheet.

To form an image, the inventive substrate is exposed to actinic radiation such that the microcapsules are image-wise exposed. Typically, exposure of the microcapsules to actinic radiation (ultraviolet, visible or infrared wavelengths) causes the internal phase of the microcapsules to polymerize, thereby preventing escape of the image-forming agent from the imaging sheet. Thereafter, the microcapsules on the imaging sheet are subjected to a uniform rupturing force in the presence of a developer material to rupture the unexposed microcapsules and form an image.

Where the image-forming agent is not a dye or pigment, a developer material is selected to react with the image-forming agent to form an image. Illustrative examples of color developers useful in conjunction with the embodiment employing the aforesaid color precursors are clay minerals such as acid clay, active clay, attapulgite, etc.; organic acids such as bannic acid, gallic acid, propyl gallate, etc.; acid polymers such as phenol-formaldehyde resins, phenol acetylene condensation resins, condensates between an organic carboxylic acid having at least one hydroxy group and formaldehyde, etc.; metal salts or aromatic carboxylic acids such as zinc salicylate, tin salicylate, zinc 2-hydroxynaphthoate, zinc 3,5-di-tert-butyl salicylate, oil soluble metal salts or phenol-formaldehyde novolak resins (e.g., see D.S. Patent Nos. 3,672,935; 3,732,120 and 3,737,410) such as zinc modified oil soluble phenolformaldehyde resin as disclosed in U.S. Pat. No. 3,732,120, zinc carbonate etc. and mixtures thereof. A preferred class of glossable developers is described in commonly assigned U.S. application Ser. No. 073,036, filed Jul. 14, 1987.

The extended dynamic range microcapsules may be used to produce monochromatic or full color images. Full-color imaging systems are described in U.S. Pat. No. 4,576,891, European Published Application No. 0233587 and U.K. Patent No. 2,113,860. These systems employ imaging sheets having three sets of microcapsules which respectively contain cyan, magenta and yellow color precursors. As explained in more detail in the above-listed references, each set of microcapsules is primarily sensitive in a different wavelength band such that the microcapsules can be individually exposed with minimum crosstalk. In panchromatic systems, the cyan, magenta, and yellow forming photosensitive microcapsules are respectively sensitive to red, green and blue light.

The resultant photosensitive microcapsules have an extended dynamic range. It is hypothesized that a batch of microcapsules having a step-wise or continuous concentration gradient characteristic of the internal phase of the microcapsules is obtained in accordance with the invention. For example, in the preferred embodiment the microcapsules may contain a concentration gradient of photoinitiator within their internal phases. As will be shown on the examples, this results in a continuous H&D curve having an extended dynamic range. By comparison, when mixing two independently prepared batches of different speed, a concentration gradient is not demonstrated and the slope of the resulting H&D curve is less continuous. However, by employing the processes as depicted in FIGS. 5 and 6 of the preferred embodiments, the H & D curve is substantially continuous and the dynamic range is much greater than in the case of blending internal phases and allowing droplet coalescence. Thus, in addition to producing extended dynamic range microcapsules in a single batch versus a multiple batch process, the photographic qualities of the microcapsules produced according to the present invention are superior. Intermixing may be controlled by optimizing the amount and presence of a permeable barrier material, permeable barrier catalyst, emulsion stabilizers and modifiers, and agitation conditions.

In addition, when the inventive photosensitive microcapsules are blended with two other sets of microcapsules to produce a full-color imaging material, improved color balance can be obtained. A problem associated with full-color imaging materials is that the H&D curves for the cyan, magenta and yellow color-forming microcapsules do not always properly align, resulting in images having colors which are not balanced. If one or two of the H&D curves need to be aligned, the inventive photosensitive microcapsules may be utilized and selected so that their corresponding H&D curve aligns with the H&D curves which were previously in alignment. Once the H&D curves of the colors in the produced images will be balanced. An example of the use of the inventive microcapsules for this application is set forth in Examples 2 and 3.

The present invention is illustrated in more detail by the following non-limiting examples.

EXAMPLE 1

To produce magenta color-forming microcapsules, the following internal phase was added to a 80 liter tank equipped with a stirrer operating at 550 rpm:

| | |
|---|---|
| Trimethylolpropane triacrylate (TMPTA) | 14.54 kg |
| 1,1'-di-n-heptyl-3,3,3',3'-tetramethyl indocarbocyanine triphenyl-n-butylborate | 63 grams |
| N,N-dimethyl-2,6-diisopropylanaline (DIDMA) | 145 grams |
| Magenta color former | 4.32 kg |
| Desmodur N-100 isocyanates | .97 kg |
| 2,6-di-tert-butyl-4-methylphenol (BHT) | 3.63 grams |

61.90% by weight of the above internal phase was added to an emulsion tank containing the following continuous phase:

| | |
|---|---|
| Water | 51.6 kg |
| Pectin | 1.52 kg |
| Versa 503 | 0.96 kg | and was stirred between 1210 and 3450 rpm at 25° C. The dispersed internal phase constitutes approximately 50% of the total internal phase to be emulsified and has a relatively fast film-speed.

In a separate tank having a volume of 5l, and being equipped with stirrer operating at 1000 rpm, the following modifying phase was added:

| | |
|---|---|
| TMPTA | 3.42 kg |
| DIDMA | 34.63 grams |
| Desmodur N-100 Isocyanates | .23 kg |

The modifying phase was then added in its entirety to the tank containing the remaining internal phase to dilute the concentration of photoinitiator in the internal phase and was stirred at 350 rpm. The remainder of the now diluted internal phase was then added to the emulsion tank and was stirred at about 4300 rpm at 36° C. The emulsion tank contained approximately 50% of a higher film speed, higher concentration magenta color-forming internal phase (high concentration of color-former and initiator) and approximately 50% of a lower film speed, lower concentration magenta color-forming internal phase (low concentration of color-former and initiator). Melamine formaldehyde microcapsules were formed around the dispersed internal phase by in situ condensation.

Figure 3:
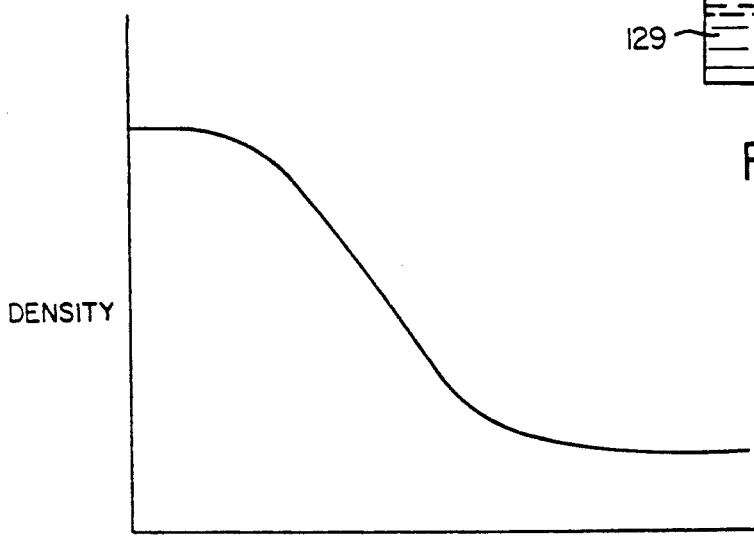
FIG. 3 is an H&D curve of a photosensitive material embodying the teachings of the instant invention.

The microcapsules were coated on an aluminized polyethylene terephthalate film exposed to green light (=550 nm) and developed in the presence of a developer material. The H&D curve for the magenta color-forming microcapsules was obtained and is shown in FIG. 3. In comparison to magenta colorforming microcapsules blended from two independent batches of microcapsules, the slope of the H&D curve for the inventive microcapsules is smooth and does not include a hump which characterizes the H&D curve of a blend.

EXAMPLE 2

The magenta color-forming microcapsules produced according to Example 1 were mixed with cyan color-forming microcapsules and yellow color-forming microcapsules and coated onto polyethylene terephthalate film. The microcapsules were exposed to a broad band visible white light source and ruptured in the presence of a developer material to produce a full color image. The RGB curve produced had the following characteristics.

| RGB Curve White Light Data | | | |
|---|---|---|---|
| | R | G | B |
| log 10% | 3.29 | 3.29 | 3.29 |
| log 90% | 2.86 | 2.88 | 2.86 |
| log 1.0 | 3.05 | 3.06 | 3.04 |

As demonstrated by the RGB curve data, the H&D curves for the three color-forming microcapsules were properly aligned and the microcapsules produced color balanced images. In comparison to H&D curves produced when using three colorforming microcapsules wherein the magenta capsules comprised a mixture of two photoinitiator concentration capsules, the curves produced by the inventive microcapsules were much more in alignment.

Having described the invention in detail and by reference to preferred embodiments thereof, it will be apparent that modifications and variations are possible without departing from the scope of the invention defined in the appended claims.

What is claimed is:

1. A process for producing a microencapsulated photosensitive composition having broadened dynamic range comprising the steps of:
   dispersing a portion of a first internal phase comprising a first concentration of photohardenable monomer, image-forming agent, and photoinitiator in a continuous phase as droplets;
   diluting a second portion of said first internal phase with an internal phase modifying material to form a second internal phase having a second concentration of said photohardenable monomer, said image-forming agent, or said photoinitiator;
   dispersing said second internal phase in said continuous phase as droplets; and
   forming a wall around said droplets.

2. The process according to claim 1 wherein said modifying material is a monomer.

3. The process of claim 1 wherein said wall is a melamine-formaldehyde resin.

4. The process of claim 1 wherein said internal phase additionally includes a permeable barrier material.

5. The process of claim 4 wherein said permeable barrier material is a polyisocyanate.

6. A microencapsulated photosensitive composition prepared by the process of claim 1.

7. The process according to claim 1 wherein said second portion of said first internal phase is incrementally diluted with said modifying material and said second internal phase is incrementally dispersed in said continuous phase.

8. The process according to claim 1 wherein said second portion of said first internal phase is continuously diluted with said modifying material and said second internal phase is continuously dispersed in said continuous phase.

9. The process according to claim 1 wherein said microencapsulated photosensitive composition is capable of producing upon development a cyan, a magenta or yellow monochrome.

10. A process for producing a microencapsulated photosensitive composition having broadened dynamic range comprising the steps of:
providing a first emulsion comprising a multiplicity of droplets of a first internal phase having a first photohardenable composition in a continuous phase;
providing a second emulsion comprising a multiplicity of droplets of a second internal phase having a second photohardenable composition in a continuous phase;
mixing said first emulsion and said second emulsion; and
forming a wall around said droplets.

11. A microencapsulated photosensitive composition prepared by the process of claim 10.

12. The process according to claim 10 wherein said microencapsulated photosensitive composition is capable of producing upon development a cyan, a magenta or yellow monochrome.

13. A process for producing a microencapsulated photosensitive composition comprising the steps of:
(a) providing a first internal phase having a first film speed;
(b) providing a second internal phase having a second film speed different from said first film speed;
(c) incrementally or continuously blending said first phase with said second phase to form a blended phase in which the concentration of said first and said second phase varies continuously or incrementally;
(d) incrementally or continuously dispersing said blended phase in at least one continuous phase to form at least one emulsion in which said blended phase forms droplets; and
(e) forming a wall around said droplets.

14. The process of claim 13 wherein said first and second internal phases are blended incrementally to form a plurality of blended phases in which the ratio of said first and second internal phases in each one of said plurality of blended phases is different; each one of said plurality of blended phases is added to a corresponding plurality of continuous phases to form a plurality of emulsions of droplets of said blended phases, said droplets are stabilized to minimize droplet intermixing, said plurality of emulsions is blended together to form a blended emulsion and microcapsule walls are formed around said droplets in said blended emulsion.

15. The process of claim 13 wherein said first and second internal phases are blended incrementally to form a plurality of blended phases in which the ratio of said first and second internal phases in each one of said plurality of blended phases is different, each one of said plurality of blended phases is incrementally added to a continuous phase to form an emulsion, and after each incremental addition, said emulsion is stabilized to prevent droplet intermixing.

16. The process of claim 15 wherein said process further includes the step of:

(f) providing a third internal phase having a film speed different than said first and second film speed,
(g) incrementally blending said third internal phase with a portion of said second internal phase to form a second blended phase in which the concentration of said first and second phase varies incrementally,
(h) incrementally dispersing said second blended phase in a continuous phase to form a second emulsion having droplets of said second blended phase,
(i) after each increment of said second blended phase, stabilizing the droplets in said emulsion to prevent substantial droplet intermixing or coalescence, and
(j) blending said emulsion and said second emulsion.

17. The process of claim 16 wherein said first internal phase, said second internal phase and said third internal phase include a photohardenable composition and an image-forming agent.

18. The process of claim 15 wherein said first internal phase, said second internal phase and said third internal phase include a photopolymerizable monomer and a photoinitiator.

19. A microencapsulated photosensitive composition prepared by the process of claim 13.

20. A microencapsulated photosensitive composition prepared by the process of claim 14.

21. The process according to claim 13 wherein said microencapsulated photosensitive composition is capable of producing upon development a cyan, a magenta or yellow monochrome.

22. A process for producing a microencapsulated photosensitive composition comprising the steps of:
(a) providing a first internal phase having a first film speed;
(b) providing a second internal phase having a second film speed which differs from said first film speed in at least one aspect;
(c) providing a third internal phase of a third film speed which differs from said first film speed and said second film speed in at least one aspect;
(d) incrementally blending said first internal phase with a first portion of said second internal phase to form increments of a first blended phase;
(e) providing said increments of said first blended phase into a first continuous phase to form a first emulsion such that said first blended phase forms droplets in which the film speed of the droplets varies incrementally;
(f) incrementally blending said third internal phase with a second portion of said second internal phase to form increments of a second blended phase;
(g) providing said increments of said second blended phase into a second continuous phase to form a second emulsion such that said second blended phase forms droplets in which the film speed of the droplets varies incrementally;
(h) forming a permeable barrier around said droplets;
(i) blending said first emulsion and said second emulsion to form a blended emulsion; and
(j) formatting of a wall around said permeable barrier and said droplets.

23. The process of claim 22 wherein said first internal phase, said second internal phase and said third internal phase include a photohardenable composition, image-forming agent and photoinitiator.

24. The process of claim 23 wherein said first internal phase is of the highest film speed concentration, said third internal phase is of the lowest film speed concentration, and said second internal phase is of an intermediate film speed concentration.

25. A microencapsulated photosensitive composition prepared by the process of claim 22.

26. The process according to claim 22 wherein said microencapsulated photosensitive composition is capable of producing upon development a cyan, a magenta or yellow monochrome.

* * * * *